April 25, 1961 K. G. MacLEAN ET AL 2,981,852
PULSE GENERATOR
Filed June 24, 1958
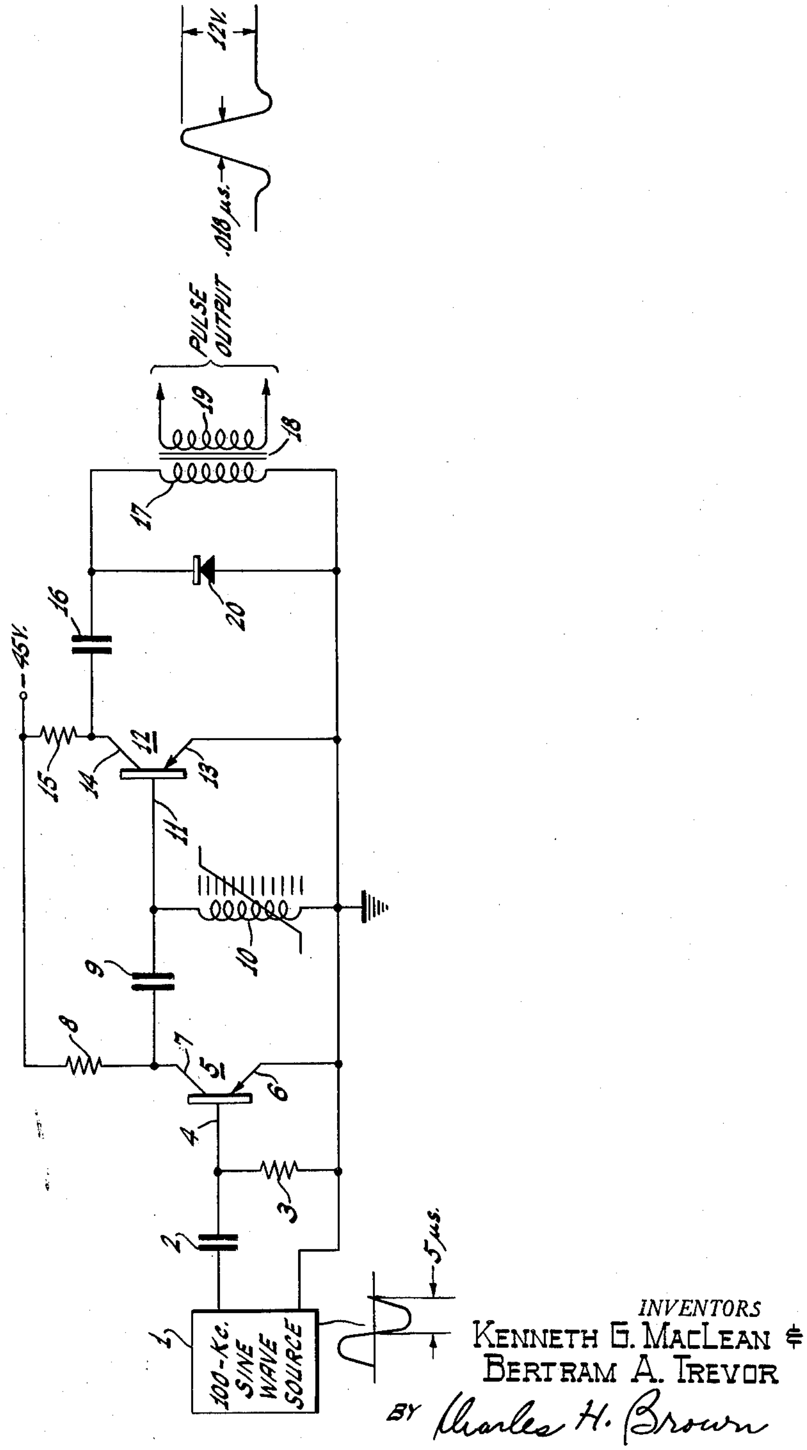
INVENTORS
KENNETH G. MACLEAN &
BERTRAM A. TREVOR
BY Charles H. Brown
ATTORNEY United States Patent Office 2,981,852 Patented Apr. 25, 1961

2,981,852

PULSE GENERATOR

Kenneth G. MacLean, Princeton, N.J., and Bertram A. Trevor, Tucson, Ariz., assignors to Radio Corporation of America, a corporation of Delaware Filed June 24, 1958, Ser. No. 744,151

10 Claims. (Cl. 307—88.5)

This invention relates to a pulse generator circuit, and more particularly to a circuit for developing short pulses from an input voltage source of substantially sinusoidal waveform, the pulse recurrence frequency being equal to the frequency of the input voltage source.

Although not limited thereto, this invention has particular application in a frequency control or frequency stabilization system using pulse locking techniques. One example of such a system is disclosed in Fig. 3 of the copending Robinson application, Serial No. 584,103, filed May 10, 1956, now United States Patent No. 2,888,562, granted May 26, 1959. A system of this type utilizes, for the frequency and phase locking of a master oscillator at selectable discrete frequencies within a rather broad frequency range, a plurality of auxiliary oscillators each locked in frequency and phase by electric pulses generated from a very stable sine wave source, such as a temperature-controlled crystal oscillator. In this system, the recurrence frequency or repetition frequency of the generated pulses corresponds exactly to the frequency of the stable sine wave source. Recently, a system of this type has been evolved which utilizes, as one of the auxiliary oscillators previously referred to, a "step" oscillator whose frequency is adjustable over a range of 2.6 to 31.4 mc., and which is phase locked at "steps" 100 kc. apart by means of synchronizing pulses having a very accurate repetition rate of 100,000 p.p.s. It has been found that the locking or synchronizing pulse should have a duration less than one half-cycle at the highest frequency to be controlled, which in this case is about 30 mc. One-half cycle at 30 mc. has a time duration of 0.017 microsecond. Experimentally, a pulse having a width of about 0.05 microsecond at the base and about 0.02 microsecond at half amplitude has been found to operate well for locking in an oscillator at 30 mc.

It is very difficult to generate by conventional circuitry pulses of this extremely short duration (about 20 millimicroseconds at half amplitude), at a pulse recurrence rate or repetition rate of 100,000 p.p.s. (corresponding to one pulse for each cycle of a 100 kc. sine wave source), and of the desired phase stability, from cycle to cycle of the sine wave source.

An object of this invention is to provide a novel circuit for generating extremely short pulses from a sine wave source.

A further object is to provide a novel pulse generator wherein the generated pulses are phase stable with the sine wave input source.

Another object is to provide a novel pulse generator circuit using transistor circuitry.

The objects of this invention are accomplished, briefly, in the following manner: the sine wave output of a stable-frequency source is differentiated and applied to the base electrode of a switching-type transistor which is biased to conduct in response to a negative voltage applied to its base. Thus, once for each cycle of the input, this transistor is driven into conduction, the resultant change of voltage at the collector electrode being utilized to cause saturation of a saturable reactor coupled to the collector electrode. When the transistor reverts to its original non-conducting state, the reactor is saturated in such a direction that a negative voltage pulse is developed thereacross. This negative pulse is applied to a second switching-type transistor, to drive the latter into conduction. The pulse appearing at the collector electrode of the second transistor is differentiated and fed to a suitable output circuit for utilization.

A detailed description of the invention follows, taken in conjunction with the accompanying drawing, wherein the single figure is a schematic diagram of a pulse generator circuit according to this invention.

Referring now to the drawing, a substantially sinusoidal voltage is fed from a suitable source 1 which provides the input for the pulse generator circuit of this invention. The source 1 may for example have a frequency of 100 kc., and the frequency of this source determines the recurrence frequency of the pulse output of the pulse generator circuit to be described, so that the pulse recurrence frequency is 100,000 p.p.s. The source 1 has a high degree of frequency stability, and it may comprise a separate crystal oscillator operating at 100 kc., or it may comprise a 10:1 frequency divider excited by a highly stable 1-mc. crystal oscillator.

The sine wave output of source 1, having for example an R.M.S. value of five volts, is fed over a series capacitor 2 and a shunt resistor 3, which together constitute a differentiating network, to the base electrode 4 of a first switching-type transistor 5. The transistor 5, in addition to base electrode 4, has an emitter electrode 6 and a collector electrode 7. The emitter electrode 6 is connected to a zero or reference potential point (indicated as ground), as is also the lower end of resistor 3 and the low potential output terminal of source 1. Thus, the emitter and base electrodes 6 and 4, respectively, are biased to the same potential, since base electrode 4 is connected to the common junction of capacitor 2 and the upper (ungrounded) end of resistor 3. In order to provide a negative bias on collector electrode 7 with respect to base electrode 4 (or ground), collector 7 is connected by way of a resistor 8 to the negative terminal —45 v. of a power supply of this order of voltage and capable of supplying a current of about 3.5 milliamperes.

The transistor 5, as indicated, is of the PNP junction type, and is preferably of the RCA developmental type TA1631. This is a switching-type transistor which has a current transfer ratio (alpha) which becomes greater than unity with increasing current, this behavior depending on a new type of semiconductor contact that collects holes at low current densities and injects electrons at high current densities. Because of its thyratron-like properties, this transistor has been named "Thyristor." The transistor 5 is so biased as to be normally non-conducting, but to be driven into conduction by a negative-going voltage applied to the base electrode 4. When the collector current is allowed to rise above a designed critical value, a regenerative-type switching action occurs. As the collector current is increased, the total current transfer ratio, $\alpha_{ce}$, increases. When $\alpha_{ce}$ becomes greater than unity, for the grounded-emitter connection illustrated, a large increase of current occurs and the voltage across the transistor drops to a very low value, on the order of a few tenths of a volt. The transition to the high conductivity mode is regenerative. After reaching the high current region, the base current can be removed without affecting the collector current. However, by the use of a reverse voltage (positive-going, with the connections illustrated) between emitter and base, the high current can be turned off. This latter action, a highly important feature for a switching device, distinguishes the "Thyristor" from a thyratron.

Summarizing the foregoing, the "Thyristor" 5 has the characteristic of a regenerative switch, becoming practically a short-circuit between collector 7 and emitter 6 when the collector current exceeds 3 milliamperes; this action occurs at a base electrode bias (bias on base electrode 4 with respect to emitter 6) of about −0.3 volt. The "Thyristor" or switching-type transistor 5 is non-conducting with a zero base electrode bias, that is, a base electrode bias of zero with respect to emitter 6.

For completeness, a short description of the geometry and fabrication of the "Thyristor" will now be given. Arsenic is diffused into a p-type germanium wafer to form an n-type base region. A circular mask is applied and the unnecessary n-type skin is etched away, thus forming a circular plateau. An emitter junction and an ohmic base connection are soldered to this plateau. The area of the base connection is determined by the size of the wire used and the amount of solder present. The amount of material used must be accurately controlled to prevent shorting through the thin (0.1-mil thick) base layer. The collector connection is made by soldering a nickel tab to the germanium of the collector with an alloy of lead, thin, and indium. The connection may cover the entire area of the germanium wafer. Typical dimensions may be as follows: hole emitter junction, 4 mils diameter; collector junction, 13 mils diameter; thickness of p-type germanium remaining, 5 mils.

For further details on the "Thyristor," reference may be had to RCA Engineer, Vol. 3, No. 5, pp. 44–47, published by Radio Corporation of America, Camden, N.J.

When the differentiated sine wave applied to base electrode 4 goes slightly negative (by about 0.3 volt) with respect to its mean or average value (which action occurs once each cycle at a 100-kc. rate), the transistor 5 is driven into conduction, producing substantially a short-circuit (or at least a very low resistance connection) between collector 7 and emitter 6. This causes a positive-going voltage change to occur at collector 7, with the voltage at this electrode moving from its original 45 volts negative, toward ground. The time required to switch the "Thyristor" 5 into the high-conductance mode is very short, on the order of 0.1 microsecond, producing a steep positive-going voltage pulse at collector 7. This positive-going signal is coupled to a saturable reactor 10 by way of a capacitor 9. One end of the winding of reactor 10 is grounded and the other end thereof is connected to that side of capacitor 9 remote from collector 7.

The positive-going collector voltage, applied to a saturable reactor 10 by way of capacitor 9, is sufficient to drive the core of this reactor into saturation, in the positive direction. When this core reaches saturation, the time rate of change of magnetic flux therein suddenly decreases to zero, inducing a rather large E.M.F. in winding 10. Since the switching time of "Thyristor" 5 is so very short, and since the saturable reactor is designed to saturate very rapidly, a very short pulse (on the order of 3 volts peak amplitude, and of .036 microsecond duration at half amplitude) is produced across winding 10. The initial pulse produced across saturable reactor 10 is a positive-going one.

In addition to the pulse-generating action as a result of the saturation of the saturable reactor 10, a partial differentiation of the positive-going pulse produced at collector 7 is effected by capacitor 9 and the winding 10, acting as a differentiating circuit. This also contributes to the shortening or sharpening of the pulses.

The voltage change occurring across winding 10 is coupled directly to the base electrode of a second switching-type transistor 12, which is preferably a "Thyristor" of exactly the same type as transistor 5, previously described. Transistor 12 has an emitter electrode 13 connected to ground, and a collector electrode 14 biased negatively from the −45 v. source by way of a resistor 15. It may thus be seen that transistor 12 is biased similarly to transistor 5, and the former is likewise normally non-conducting, but is adapted to be driven into conduction by a negative-going voltage applied to its base electrode 11.

The initial positive-going pulse produced across winding 10, and applied to base electrode 11, has no appreciable effect on transistor 12, since this pulse has a polarity such as to only bias the transistor further in the non-conducting direction.

When the differentiated sine wave applied to base 4 goes back from its initially-assumed negative value to its mean or average value (giving a zero base bias on transistor 5), the transistor 5 is very rapidly driven back into non-conduction, or in other words the high-conductance mode is switched off. The time required for this switch-off is of the order of 0.1 microsecond. When transistor 5 is switched off, the collector voltage suddenly drops from a level of about zero or ground to −45 volts, producing a negative-going voltage signal at collector 7. This negative-going collector voltage, coupled to saturable reactor 10, drives the core of this reactor into saturation, in the negative direction. A very short pulse, of rather high amplitude, is again induced in winding 10, due to the sudden change in the time rate of change of magnetic flux in the core. Since the conditions involved in the saturation of the core are now reversed as compared to the initial conditions, this subsequent pulse is a negative-going one.

This subsequent negative-going pulse may have an amplitude and time duration similar to those of the initial positive-going pulse. Such pulse is applied to the base electrode 11, and operates to drive the transistor 12 into conduction. Then, substantially a short-circuit is produced between collector 14 and emitter 13, causing a positive-going voltage pulse to occur at collector 14, the action here being the same as that occurring when transistor 5 is driven into conduction.

The positive-going voltage pulse at collector 14 is coupled through a capacitor 16 to the primary winding 17 of an output transformer 18. The capacitor 16 and winding 17 constitute an RC circuit which differentiates the pulse appearing at collector 14, to give an output pulse (across the secondary winding 19 of transformer 18) of 12 volts peak amplitude, with about 18 millimicroseconds duration at half amplitude, as indicated on the drawing.

Since the transistor 12 is driven into conduction by each negative-going pulse developed across the saturable reactor winding, and since a negative-going pulse is developed across such reactor in response to each passage of the sine wave input voltage from a negative to a zero value, it may be appreciated that one output pulse is produced for each cycle of the sine wave input, so that the output pulses have a recurrence frequency uniquely determined by, and exactly equal to, the frequency of the sine wave source 1. For the example given, then, the pulses recur at a rate of 100,000 p.p.s.

Following the production of the "subsequent" or negative-going pulse across the saturable reactor winding (which occurs when the sine wave input goes from a negative value to zero), and during the next cycle of the sine wave input, such input goes back to a slightly negative value, driving transistor 5 into conduction and producing a positive-going pulse across the saturable reactor. This positive-going pulse drives transistor 12 very rapidly back into non-conduction, causing the voltage at collector 14 to very rapidly go negative, from about ground or zero potential to −45 volts. This produces a negative-going voltage pulse at collector 14. This pulse, however, is bypassed away from the primary winding 17 (and hence also from the output winding 19) by means of a diode 20 connected across such primary winding. Diode 20 is so poled as to conduct whenever a negative-going pulse is produced at collector 14.

Although the previous explanation has proceeded on the assumption that the positive-going pulse produced at collector 14 is the one utilized as output, the negative-going pulse produced at this electrode can be utilized if desired, and this might be desired if the latter were of shorter duration than the former. To utilize the negative-going pulse produced at collector 14, the diode 20 could be reversed. Also, the output transformer leads could be reversed, if this were found necessary or desirable.

The first transistor 5 conducts for about 70% of each cycle of the 100-kc. sine wave, and draws an average current of about 3 ma. The conduction time of the second transistor 12 is much less, resulting in about 0.5 ma. average current drawn.

The pulse output at 19 is free of jitter, that is, it is phase stable, or synchronous from cycle to cycle of the sine wave input.

By way of example, the saturable reactor 10 may comprise 19 turns of No. 34 enameled wire on two square loop ferrite cores, each of which latter is 80 mils in diameter by 50 mils thick. The output transformer 18 may be wound with 16 turns primary, 16 turns secondary, on a ferrite core 3/8" diameter by 1/8" thick, with a 3/16" diameter hole. Other component values are given below by way of example, for circuit arrangement built according to this invention and successfully tested.

| | | |
|---|---|---|
| Capacitor: | | |
| 2 | mmfd | 1,000 |
| 9 | do | 47 |
| 16 | do | 56 |
| Resistor: | | |
| 3 | ohms | 240 |
| 8 | do | 12,000 |
| 15 | do | 12,000 |

What is claimed is:

1. In a pulse generator circuit, a first switching-type transistor having a current transfer ratio which becomes greater than unity with increasing collector current, said transistor having base, collector, and emitter electrodes; means biasing said transistor for conduction in response to a voltage of a certain polarity applied to said base electrode, means for applying an alternating voltage to said base electrode, a saturable reactor coupled to said collector electrode and adapted to be driven into saturation in response to conduction and to non-conduction in said transistor, the reaching of saturation by said reactor causing a voltage pulse of predetermined polarity to be developed across the same, a second switching-type transistor having a current transfer ratio which becomes greater than unity with increasing collector current, said transistor having base, collector, and emitter electrodes; means biasing said second transistor for conduction in response to a voltage of predetermined polarity applied to said last-mentioned base electrode, and means for applying said voltage pulse to said last-mentioned base electrode, thereby to drive said second transistor into conduction.

2. In a pulse generator circuit, a first switching-type transistor having a current transfer ratio which becomes greater than unit with increasing collector current, said transistor having base, collector, and emitter electrodes; means biasing said transistor for conduction in response to a voltage of a certain polarity applied to said base electrode, means for applying an alternating voltage to said base electrode, a saturable reactor coupled to said collector electrode and adapted to be driven into saturation in response to conduction and to non-conduction in said transistor, the reaching of saturation in one direction by said reactor causing a voltage pulse of negative polarity to be developed across the same, a second switching-type transistor having a current transfer ratio which becomes greater than unity with increasing collector current, said transistor having base, collector, and emitter electrodes; means biasing said second transistor for conduction in response to a voltage of negative polarity applied to said last-mentioned base electrode, means for applying said voltage pulse to said last-mentioned base electrode, and an output circuit coupled to said last-mentioned collector electrode.

3. In a pulse generator circuit, a first switching-type transistor having a current transfer ratio which becomes greater than unity with increasing collector current, said transistor having base, collector, and emitter electrodes; means biasing said collector electrode negatively with respect to said base electrode and biasing said emitter and base electrodes to the same potential, whereby said transistor may be driven into conduction by a negative-going voltage applied to said base electrode, means for applying an alternating voltage to said base electrode, thereby to drive said transistor into conduction during each negative-going half-cycle of said alternating voltage, a saturable reactor coupled to said collector electrode and adapted to be driven into saturation in response to conduction and to non-conduction in said transistor, the reaching of saturation by said reactor causing a voltage pulse of predetermined polarity to be developed across the same, a second switching-type transistor having a current transfer ratio which becomes greater than unity with increasing collector current, said transistor having base, collector, and emitter electrodes; means biasing said second transistor for conduction in response to a voltage of predetermined polarity applied to said last-mentioned base electrode, and means for applying said voltage pulse to said last-mentioned base electrode, thereby to drive said second transistor into conduction.

4. In a pulse generator circuit, a first switching-type transistor having a current transfer ratio which becomes greater than unity with increasing collector current, said transistor having base, collector, and emitter electrodes; means biasing said transistor for conduction in response to a voltage of a certain polarity applied to said base electrode, a source of alternating voltage coupled to said base electrode, a differentiating circuit in the coupling between said source and said base electrode, a saturable reactor coupled to said collector electrode and adapted to be driven into saturation in response to conduction and to non-conduction in said transistor, the reaching of saturation by said reactor causing a voltage pulse of predetermined polarity to be developed across the same, a second switching-type transistor having a current transfer ratio which becomes greater than unity with increasing collector current, said transistor having base, collector, and emitter electrodes; means biasing said second transistor for conduction in response to a voltage of predetermined polarity applied to said last-mentioned base electrode, and means for applying said voltage pulse to said last-mentioned base electrode, thereby to drive said second transistor into conduction.

5. In a pulse generator circuit, a first switching-type transistor having a current transfer ratio which becomes greater than unity with increasing collector current, said transistor having base, collector, and emitter electrodes; means biasing said transistor for conduction in response to a voltage of a certain polarity applied to said base electrode, means for applying an alternating voltage to said base electrode, a saturable reactor coupled to said collector electrode and adapted to be driven into saturation in response to conduction and to non-conduction in said transistor, the reaching of saturation in one direction by said reactor causing a negative-going voltage pulse to be developed across the same, a second switching-type transistor having a current transfer ratio which becomes greater than unity with increasing collector current, said transistor having base, collector, and emitter electrodes; means biasing said second transistor for conduction in response to a negative-going voltage applied to said last-mentioned base electrode, and means for applying said voltage pulse to said last-mentioned base electrode, thereby to drive said second transistor into conduction.

6. In a pulse generator circuit, a first switching-type transistor having a current transfer ratio which becomes greater than unity with increasing collector current, said transistor having base, collector, and emitter electrodes; means biasing said transistor for conduction in response to a negative-going voltage applied to said base electrode, means for applying an alternating voltage to said base electrode, thereby to drive said transistor into conduction during each negative-going half-cycle of said alternating voltage, a saturable reactor coupled to said collector electrode and adapted to be driven into saturation in response to conduction and to non-conduction in said transistor, the reaching of saturation in one direction by said reactor causing a negative-going voltage pulse to be developed across the same, a second switching-type transistor having a current transfer ratio which becomes greater than unity with increasing collector current, said transistor having base, collector, and emitter electrodes; means biasing said transistor for conduction in response to a negative-going voltage applied to said last-mentioned base electrode, and means for applying said voltage pulse to said last-mentioned base electrode, thereby to drive said second transistor into conduction.

7. In a pulse generator circuit, a first switching-type transistor having a current transfer ratio which becomes greater than unity with increasing collector current, said transistor having base, collector, and emitter electrodes; means biasing said collector electrode negatively with respect to said base electrode and biasing said emitter and base electrodes to the same potential, a source of alternating voltage coupled to said base and emitter electrodes, a saturable reactor coupled to said collector and emitter electrodes, a second switching-type transistor having a current transfer ratio which becomes greater than unity with increasing collector current, said transistor having base, collector, and emitter electrodes; means biasing the last-named collector electrode negatively with respect to the last-named base electrode and biasing the last-named emitter and base electrodes to the same potential, means coupling said saturable reactor to the last-named base and emitter electrodes, and a signal utilization circuit coupled to the last-named collector and emitter electrodes.

8. A pulse generator circuit in accordance with claim 7, wherein said signal utilization circuit includes a differentiating circuit.

9. A pulse generator circuit in accordance with claim 7, including also a differentiating circuit in the coupling between and alternating voltage source and the first-named base and emitter electrodes.

10. A pulse generator circuit in accordance with claim 7, wherein the coupling between the alternating voltage source and the first-named base and emitter electrodes includes a differentiating circuit, and wherein the signal utilization circuit includes a differentiating circuit.

References Cited in the file of this patent

UNITED STATES PATENTS

| | | |
|---|---|---|
| 2,801,296 | Blecher | July 30, 1957 |
| 2,850,650 | Meacham | Sept. 2, 1958 |
| 2,863,068 | Ghandi | Dec. 2, 1958 |
| 2,912,597 | Sziklai et al. | Nov. 10, 1959 |